US011367707B2

(12) United States Patent
Liff et al.

(10) Patent No.: US 11,367,707 B2
(45) Date of Patent: Jun. 21, 2022

(54) SEMICONDUCTOR PACKAGE OR STRUCTURE WITH DUAL-SIDED INTERPOSERS AND MEMORY

(71) Applicant: Intel Corporation, Santa Clara, CA (US)

(72) Inventors: Shawna M. Liff, Scottsdale, AZ (US); Adel A. Elsherbini, Chandler, AZ (US); Johanna M. Swan, Scottsdale, AZ (US); Gerald S. Pasdast, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 757 days.

(21) Appl. No.: 16/142,509

(22) Filed: Sep. 26, 2018

(65) Prior Publication Data

US 2020/0098724 A1    Mar. 26, 2020

(51) Int. Cl.
*H01L 25/065* (2006.01)
*H01L 23/498* (2006.01)
*H01L 25/00* (2006.01)
*H01L 23/36* (2006.01)

(52) U.S. Cl.
CPC .......... *H01L 25/0652* (2013.01); *H01L 23/36* (2013.01); *H01L 23/49822* (2013.01); *H01L 25/50* (2013.01); *H01L 2225/06517* (2013.01)

(58) Field of Classification Search
CPC .................................................. H01L 25/0652
See application file for complete search history.

(56) References Cited

U.S. PATENT DOCUMENTS

| | | | |
|---|---|---|---|
| 8,471,376 B1 * | 6/2013 | Liou | H01L 24/73 257/686 |
| 10,317,459 B2 * | 6/2019 | Chadha | G01R 31/2853 |
| 10,394,737 B1 * | 8/2019 | Ngo | G06F 13/4291 |
| 2009/0039492 A1 * | 2/2009 | Kang | G11C 5/025 257/686 |
| 2010/0062621 A1 * | 3/2010 | Bruennert | H05K 1/144 439/68 |
| 2010/0213600 A1 * | 8/2010 | Lau | H01L 23/5384 257/693 |
| 2015/0216030 A1 * | 7/2015 | Semmelmeyer | H01L 25/0652 361/803 |
| 2015/0333049 A1 * | 11/2015 | Woychik | H01L 23/49827 438/107 |
| 2016/0079219 A1 * | 3/2016 | Hosomi | H01L 23/49827 257/774 |
| 2018/0026013 A1 * | 1/2018 | Yun | H01L 24/06 257/48 |
| 2018/0033731 A1 * | 2/2018 | Betsui | H01L 25/18 |
| 2018/0046908 A1 * | 2/2018 | Cox | G06F 3/06 |
| 2018/0182734 A1 * | 6/2018 | Singh | H01L 25/18 |
| 2018/0190635 A1 * | 7/2018 | Choi | H01L 25/0657 |
| 2018/0204827 A1 * | 7/2018 | Betsui | H01L 24/17 |
| 2018/0210830 A1 * | 7/2018 | Malladi | G06F 12/0866 |

(Continued)

*Primary Examiner* — Mamadou L Diallo
(74) *Attorney, Agent, or Firm* — Patent Capital Group

(57) ABSTRACT

Embodiments herein may relate to a semiconductor package or a semiconductor package structure. The package or package structure may include an interposer with a memory coupled to one side and a processing unit coupled to the other side. A third chip may be coupled with the interposer adjacent to the processing unit. Other embodiments may be described and/or claimed.

25 Claims, 10 Drawing Sheets

(56) References Cited

U.S. PATENT DOCUMENTS

| | | | |
|---|---|---|---|
| 2018/0358313 A1* | 12/2018 | Newman | G06F 12/0802 |
| 2019/0079886 A1* | 3/2019 | Malladi | G06F 9/445 |
| 2019/0385997 A1* | 12/2019 | Choi | H01L 25/0657 |
| 2020/0075567 A1* | 3/2020 | Collins | H01L 23/13 |
| 2020/0098725 A1* | 3/2020 | Liff | H01L 24/16 |
| 2020/0226094 A1* | 7/2020 | Teh | G06F 1/06 |

* cited by examiner

SEMICONDUCTOR PACKAGE OR STRUCTURE WITH DUAL-SIDED INTERPOSERS AND MEMORY

BACKGROUND

Compute intensive applications such as machine learning, computer vision, or deep learning may drive a need for more compute power or acceleration of computation power. This need may result in leveraging of processor cores, additional executable units (EUs) via general processing units (GPUs), additional field programmable gate arrays (FPGAs), etc. Consequently, manufacturers may pair more GPUs or FPGAs on a single package, and pair the GPUs/FPGAs with local memory to enable low-latency/high-speed access to the memory.

DETAILED DESCRIPTION

Figure 1:
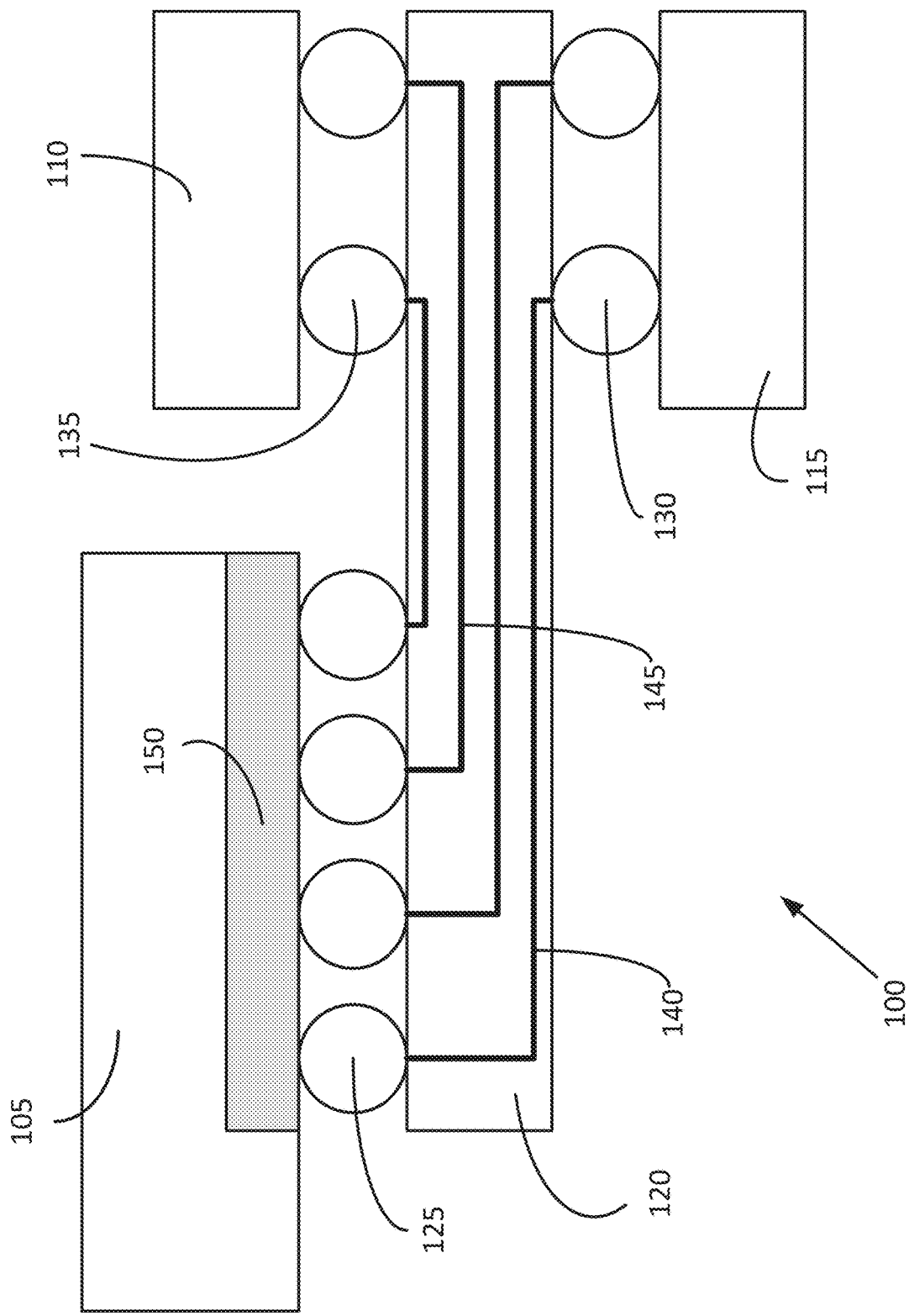
FIG. 1 depicts an example semiconductor package structure, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise.

Additionally, descriptions of Figures herein may be made with reference to specific elements illustrated and enumerated in the Figures. However, it will be understood that each and every element may not be enumerated for the sake of clarity, conciseness, and lack of redundancy. Rather, only one of some repeated elements may be enumerated and discussed, and other similarly situated elements may include aspects of the discussed elements.

Generally, as used herein, "die" is used as a generic term unless otherwise stated. "Die" may refer to a monolithic silicon or other semiconductor die, a fan-out or fan-in die package, a die stack, etc. The die stack may be, for example, a wafer stack, a die stack, or some other stack.

As noted previously, in many cases memory is being used on a package with a processing unit such as a FPGA or a GPU to increase the speed and efficiency of the package. In some embodiments, the memory may be a high bandwidth memory (HBM), which may for example be a memory that is in accordance with the joint electron device engineering council (JEDEC) "HIGH BANDWIDTH MEMORY (HBM) DRAM" document JESD235A, published November, 2015. Generally, the HBM may be referred to as a "memory stack" and may include a number of memory slices that may be coupled with a base die that serves as a memory controller. The memory stack may include, for example, 2, 4, or 8 memory slices, each of which may be approximately one gigabyte (GB) of memory. In embodiments, each stack may send or receive data on a bus that may have a bandwidth of, for example, 256 bits per memory slice.

However, in some cases the stacks may be relatively expensive and there may be a negative impact by compounding multiple die stack attaches on a single package. As a result, manufacturers may optimize the number of stacks, and the capacity of the stack, for a specific product. Furthermore, thermal constraints related to the stacks may be important. Specifically, for maximum performance the junction temperature of the stack's memory controller may need to be less than or equal to approximately 95 degrees Celsius. Sometimes, cooling of the memory controller may become challenging as the size of the memory stack increases.

Embodiments herein relate to use of an integrated circuit (IC) such as an interposer with interconnects on both top and bottom. The interposer may also be referred to as a "bridge with direct electrical interconnect on both top and bottom," however for the sake of consistency herein the term "interposer" will be generally used. The interconnects may be based on, for example, through-silicon-vias (TSVs) or IC stacking. The interposer itself may be passive or active. As used herein, a "passive" interposer may refer to an interposer that is configured to convey signals through the interposer without altering the signals with active circuitry. An "active" interposer may refer to an interposer that includes transistors, logic, or a processor, and is configured to alter the signals in some manner. The interposer may be used to stitch two or more one-sided ICs or pre-assembled stacks together. Specifically, in some embodiments memory or memory stacks may be embedded within the substrate of the package. This configuration may enable the package to satisfy various workloads such as deep learning, machine learning, artificial intelligence, virtual reality, or cloud workloads by expanding the available memory nearby.

More specifically, embodiments herein may provide an option to allow higher density or higher bandwidth memory. This higher density or bandwidth may be accomplished by attaching memory stack on both sides of an interposer. FIG. 1 depicts an example embodiment wherein a semiconductor package structure 100 has memory or memory stacks coupled on both side of a passive dual-sided interconnect. Generally, the semiconductor package structure 100 may be considered as a sub-package or a sub-structure that may be used in a semiconductor package.

Specifically, the semiconductor package structure 100 may include a processing unit 105. The processing unit 105 may be, for example, a GPU, an FPGA, a central processing unit (CPU), a multi-core CPU, or some other type of processing unit. Semiconductor package structure 100 may further include a memory 115. The memory 115 may be, for example, a dynamic random-access memory (DRAM), an HBM memory, a non-volatile memory (NVM), an embedded DRAM (eDRAM), a static random-access memory (SRAM), or a memory stack that includes a plurality of memory slices as described above. In embodiments, each of the memory slices may be a 1 GB DRAM chip, or some other type of memory or memory capacity. In some embodiments, the memory 115 may include a memory controller as part of the memory stack or memory slice.

The semiconductor package structure 100 may further include an additional element 110. In some embodiments, the additional element 110 may be a memory similar to memory 115. More specifically, the additional element 110 may be a DRAM, a memory stack, or some other type of memory. In other embodiments, the additional element 110 may be a heat sink or thermal management device that is thermally coupled with the memory 115, as will be described in further detail below. In embodiments where additional element 110 is a memory, the additional element 110 may be the same type of memory as memory 115. For example, both additional element 110 and memory 115 may be a DRAM, a SRAM, etc. In other embodiments, additional element 110 and memory 115 may be different types of memory.

The processing unit 105, additional element 110, and memory 115 may all be coupled with an interposer 120 by electrical interconnects such as solder bumps 125, 130, and 135. In embodiments, the solder bumps may include tin, tin silver, copper, lead, bismuth, nickel, aluminum combinations thereof, or some other solder material. Although each of solder bumps 125, 130, and 135 are depicted in FIG. 1 as having generally the same size as one another, in other embodiments respective ones of solder bumps 125, 130, and 135 may be a different size than another one of solder bumps 125, 130, and 135; or may be plated directly with copper pending the order of fabrication.

Generally, it will be understood that descriptions of various embodiments herein, both in FIG. 1 or embodiments of other Figures, may be made with reference to "solder bumps," however in one or more embodiments the solder bumps may be replaced by a different type of electrical interconnect such as a pad, a pillar, a redistribution layer, one or more of the above (e.g., a plurality of redistribution layers), some combination of the above, or some other type of conductive element. For example, the pad may include copper, gold, aluminum, or some other conductive material. In embodiments, the portions of the semiconductor package structures or semiconductor packages depicted as including solder bumps may include both solder bumps and another type of electrical interconnect such as redistribution layers, pillars, or pads. However, the additional electrical interconnects may not be specifically depicted herein for the sake of clarity of the illustration and lack of clutter.

The interposer 120 may be a passive interposer that may include silicon, glass, an alternative ceramic, or some other similar material. Alternatively, the interposer 120 may be an active interposer which may include silicon, silicon-on-insulator, silicon-germanium, or some other IC process technology. Specifically, the interposer 120 may be formed with a multi-layered dielectric material such as silicon dioxide, a carbon-doped silicon oxide, polyimide or other photo-imagable dielectric, or epoxy and silicon dioxide composite dielectric that is not photo-imagable and which may be referred to as a build-up film, or some other dielectric material. The interposer 120 may include a plurality of conductive elements such as traces, vias, or other elements such as inductors or capacitors. The traces or vias may be formed of one or more conductive materials such as copper, aluminum, gold, or some other conductive material. In some embodiments, piezoelectric or magnetic material may be added to the interposer 120, and particularly the conductive elements, to increase inductance and capacitance. In some embodiments, these elements may be found on either side of the interposer 120, or on both sides of the interposer 120.

The conductive elements may form a variety of conductive pathways 140 and 145 between the processing unit 105. Specifically, the conductive pathways 140/145 may include one or more traces or vias. As used herein, a trace may refer to an element that is generally parallel to the face of the interposer 120 to which the memory 115 is coupled, and a "via" may refer to an element that is generally perpendicular to a trace and may provide a communicative path from one layer of the interposer 120 to another layer of the interposer. As can be seen in FIG. 1, conductive pathway 145 may provide a communicative pathway between the processing unit 105 and the additional element 110. Conductive pathway 140 may provide a communicative pathway between the processing unit 105 and the memory 115.

In embodiments, the interposer 120 may be passive as described above. That is, the interposer 120 may not have on-board processing or logic. Therefore, in this embodiment the memory control logic 150 may be an element of the processing unit 105 as described above. More specifically, in some embodiments the memory control logic 150 may be an element of the processing unit 105 and implemented as hardware, firmware, software, or some combination thereof. In other embodiments, the memory control logic 150 may be separate from but physically and communicatively coupled with the processing unit.

In embodiments, the memory control logic 150 may be configured to generate a memory access request based on a signal from the processing unit 105. The memory access request may be, for example, a read or write request that is to either alter data within the memory 115 or the additional element 110 (if the additional element 110 is memory), or interpret data from the memory 115 or additional element 110. As part of the generation of the memory access request, the memory control logic 150 may be able to identify a memory location within the memory 115 or the additional element 110 to which the read or write command should go. Based on whether the memory location is within the memory 115 or the additional element 110, the memory control logic 150 may transmit the memory access request along conductive pathway 140 or conductive pathway 145. If the memory access request is a read command, the read data may then be transmitted back along the appropriate conductive pathway 140/145 to memory control logic 150. It will be understood, however, that this embodiment is a one example embodiment, and in other embodiments the memory control logic may be additionally or alternatively be placed in the additional element 110, the memory 115, or both the additional element 110 and the memory 115.

Figure 2:
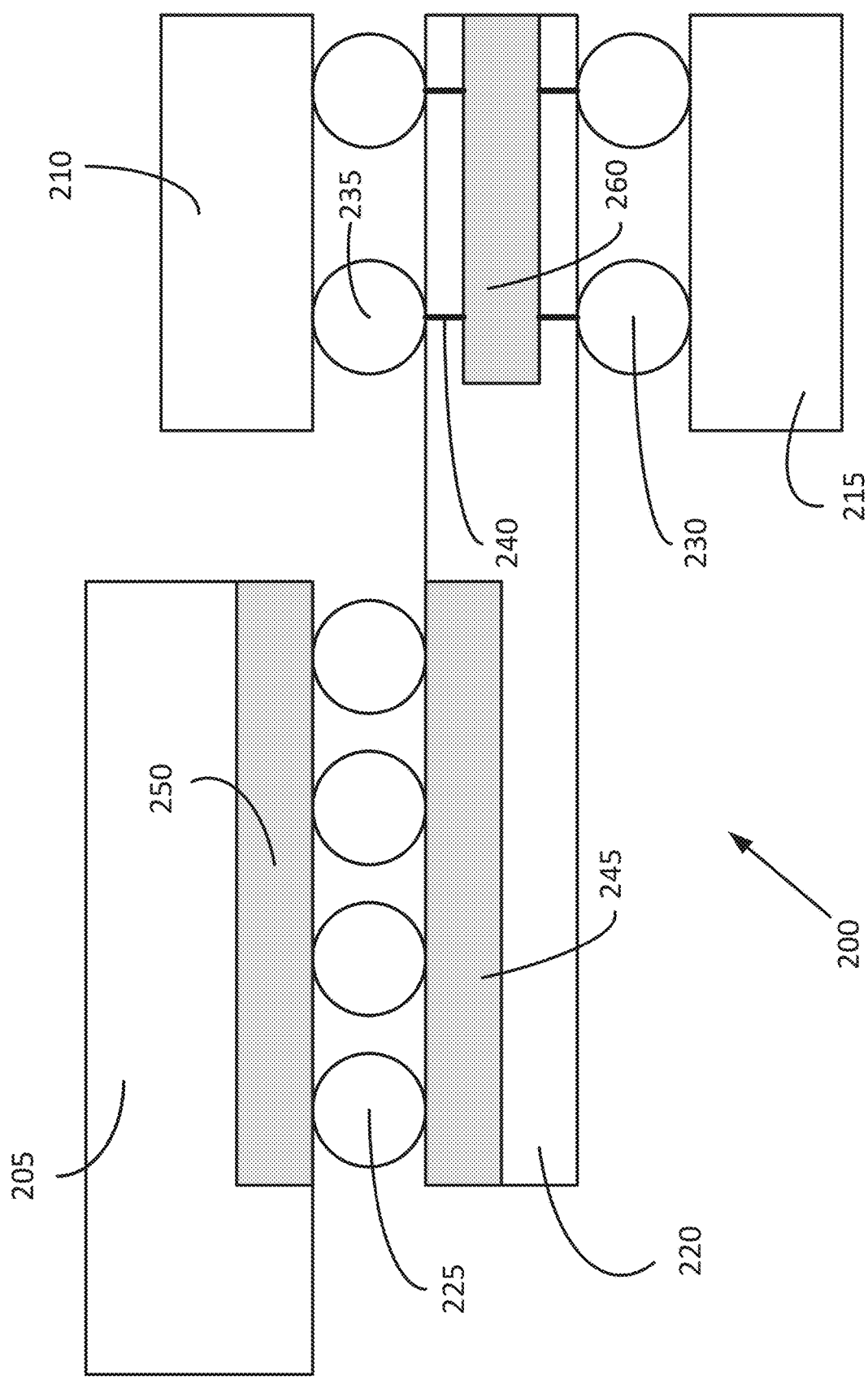
FIG. 2 depicts an alternative example semiconductor package structure, in accordance with various embodiments.

FIG. 2 depicts an alternative embodiment of a semiconductor package structure 200 that includes an active interposer rather than a passive interposer. Specifically, semiconductor package structure 200 includes a processing unit 205, an additional element 210, memory 215, and solder bumps 225/230/235, which may be respectively similar to processing unit 105, additional element 110, memory 115, and solder bumps 125/130/135.

Interposer 220 may be similar to interposer 120, in that interposer 220 may be formed of a semiconductor substrate with a plurality of vias or traces therein. However, interposer 220 may be an "active" interposer which may include logic. Specifically, the interposer 220 may include memory control logic 260 that is coupled with the additional element 210 and the memory 215 by conductive pathways 240. Generally, conductive pathways 240 may be similar to conductive pathways 140, described above, in that they may be formed of a conductive material such as gold, copper, etc. and may include one or more traces or vias.

In embodiments, herein, the memory control logic for the semiconductor package structure 200 may be distributed between the interposer 220 and the processing unit 205. Such a distribution may be based on, for example, maximizing performance given the workloads prescribed. Specifically, memory control logic 260 may be communicatively coupled with memory control logic 245, for example by one or more traces, vias, or some other conductive element within the interposer 220 which are not shown in FIG. 2 for the sake of avoidance of extraneous clutter. The memory control logic 245 may, in turn, be coupled with memory control logic 250 of processing unit 205. In embodiments, memory control logic 250 of processing unit 205 may be configured to generate a memory access request.

The memory access request may be transmitted from memory control logic 250 to memory control logic 245. The memory access request may then be transmitted from memory control logic 245 to memory control logic 260 which may, in turn be configured to access memory 215 or additional element 210 to read or write data into or out of the memory 215 or the additional element 210. If data is read from the memory 215 or additional element 210, then the data may be transferred back along the reverse path to processing unit 205. In some embodiments, one or more of memory control logic 245, 250, or 260 may be configured to alter the memory access request, for example by inserting a memory address into the memory access request or some other form of processing or alteration.

Generally, it will be understood that the depiction of semiconductor package structure 200 is intended as one example, however in other embodiments one or more of the various memory control logics 245/250/260 may not be present or may be located in a different portion of the semiconductor package or semiconductor package structure. For example, in some embodiments memory control logic 245 or 260 may not be present. In some embodiments, one or both of the additional element 210 and the memory 215 may include memory control logic in addition to, or in place of, one or more of memory control logics 245/250/260.

Operation of a semiconductor package structure such as semiconductor package structures 100 or 200, or a semiconductor package that includes semiconductor package structures 100 or 200, may be given below with respect to semiconductor package structure 100. However, it will be understood that the operations described below may additional be applicable to semiconductor package structure 200 with minimal, or no, modification.

Generally, if additional element 110 is a memory, then additional element 110 and memory 115 may share the same data bus and be selected through the address bus. That is, additional element 110 may have a certain address space, and the memory 115 may have a separate address space. This memory address configuration may allow doubling of the memory capacity with the same number of signals as a single stack. This doubling may allow use of a single memory controller, for example memory control logic 150, for both memory 115 and additional element 110, as long as the two elements can be programmed to have different memory address space.

Alternatively, memory 115 and additional element 110 may share the same address space, but have twice as many data signals (e.g., double the width of the data bus). Specifically, instead of 1024 bits at each address, there may be 2048 bits per address between memory 115 and additional element 110. This shared address space may allow for doubling of the bandwidth and capacity of the total memory available to the processing unit 105. However, the shared address space may require a larger number of signals (roughly 2× the number of data signals) to the processing unit 105 than if the memory address space was not shared.

Other embodiments may have other possible configurations (e.g., the memory 115 and additional element 110 may operate at single or double the bus width depending on the workload requirements). Specifically, dependent on the workload requirements of the semiconductor package structure 100 (or a package that includes the semiconductor package structure), the memory 115 and additional element 110 may either have separate memory address spaces, or share the same memory address space. This reconfiguration may be done through a memory controller such as the memory control logic 150 and the interposer-to-die interface, e.g. The interface between interposer 120 and processing unit 105. When the memory 115 and additional element 110 are operating at 1024-bit operation and using different memory address, then the data may be transmitted at a 1× rate through 1024 bumps (e.g., solder bumps 125) between interposer 120 and processing unit 105. When the memory 115 and additional element 110 are operating at 2048-bit operation, the data rate and address bus rate may be doubled (e.g., using 2 bits per memory clock cycle) through the same 1024 solder bumps 125 between the interposer 120 and the processing unit 105.

Generally, it will be understood that the depictions of elements of FIGS. 1 and 2 are intended merely as simplified examples for the ease of illustration and description. Relative sizes or numbers of elements in other embodiments may vary. Furthermore, these units may be coupled to a cored or coreless or ceramic substrate and then to a board. They may be coupled to these substrates through assembly or embedding. For example, although only four solder bumps 125 are depicted in FIG. 1, in some embodiments there may be as many as 1024 solder bumps that couple the processing unit 105 to the interposer 120. In other embodiments, there may be on the order of millions of solder bumps that couple the processing unit 105 to the interposer. For example, some of the solder bumps may be power bumps, ground bumps, etc. Additionally, as noted above, one or more of the solder bumps may be replaced by plated copper. Additionally, in embodiments elements such as the processing unit 105, additional element 110, memory 115, or other elements may be taller/shorter/wider/narrower/bigger/smaller/etc. than depicted in FIG. 1. Finally, it will be understood that although the description above is provided with respect to semiconductor package structure 100, it may similarly be applicable to corresponding elements of semiconductor package structure 200.

Figure 3:
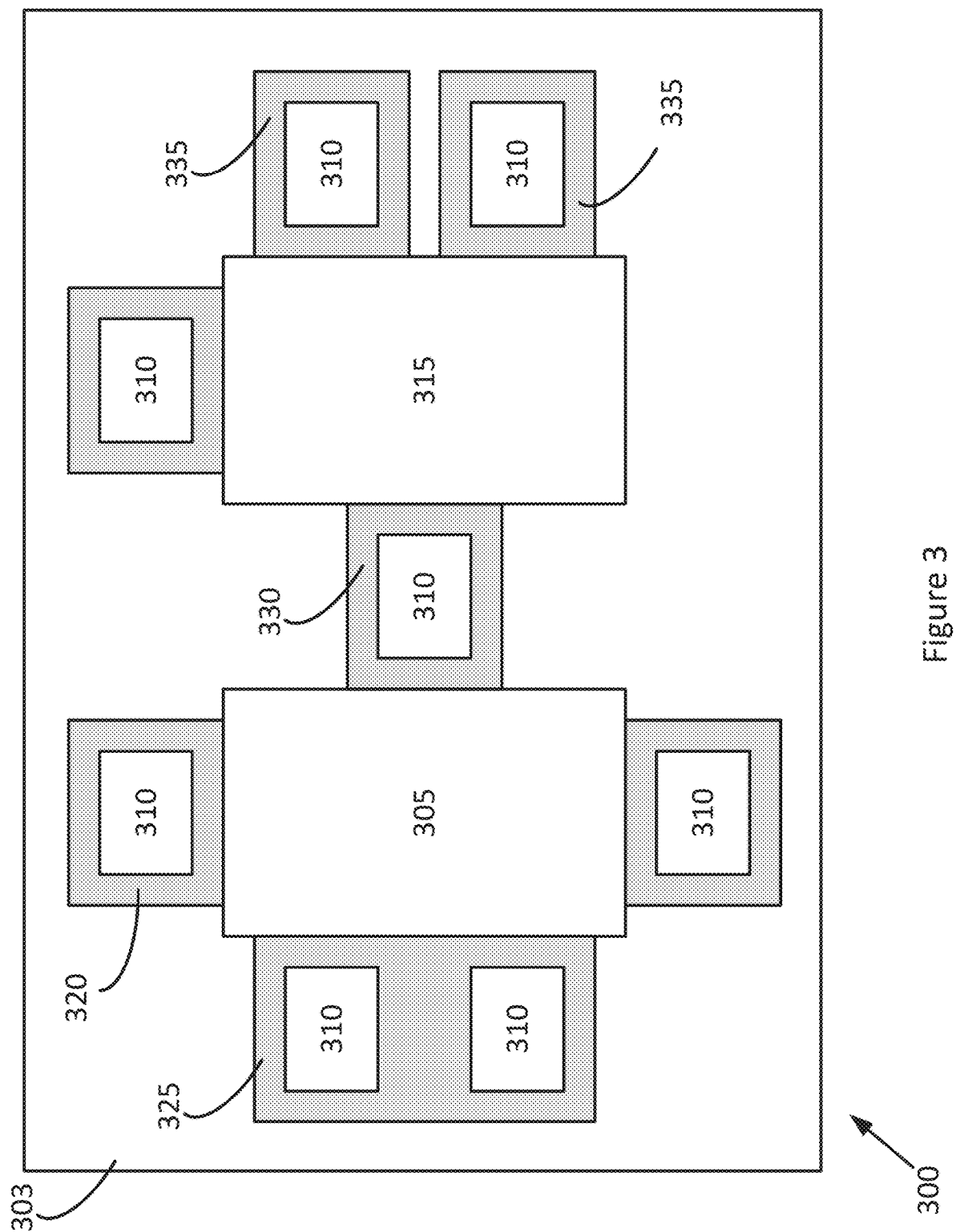
FIG. 3 depicts an example semiconductor package that may use one or more of the semiconductor package structures herein, in accordance with various embodiments.

The user of an interposer such as interposers 120 or 220 may allow different possible structural arrangements to enable a network of interconnection such as is shown in FIG. 3 with respect to package 300 wherein the interposer may be used as a bridge between various structural elements to increase the computational performance of the package. Specifically, the package 300 may include a plurality of processing units 305 and 315, which may be similar to processing units 105 or 205. The package 300 may also include a plurality of interposers such as interposers 320/325/330/335, which may be similar to interposers 120 or 220. The package 300 may also include a plurality of memories 310, which may be similar to memories 115 or 215. In embodiments, the memories 310 may be positioned on a side of the interposers 320/325/330/335 that is opposite the side of the interposers to which the processing units 305/315 are coupled. In other embodiments, one or more of the memories 310 may be on the same side of the interposers 320/325/330/335 as the side to which the processing units 305/315 are coupled. In embodiments, one or more of the elements such as the interposer 320/325/330/335, memories 310, or processing units 305/315 may be coupled with a substrate 303. The substrate may be, for example, a substrate of a printed circuit board (PCB), an interposer, or some other type of substrate.

As can be seen, one of the interposers such as interposer 330 may be communicatively and physically coupled with both processing units 305 and 315. This coupling with two processing units may be referred to as "stitching" the processing units together. Some processing units, e.g., processing unit 305, may have interposers on each side of the processing unit. More specifically, the interposers 320/325/335 may extend from the processing units 305/315 in a cantilevered fashion. Other processing units, e.g., processing unit 315, may not have an interposer coupled with one or more sides of the processing units. In some embodiments, a processing unit such as processing unit 315 may have two interposers 335 coupled with a single side of the processing unit, and each of the interposers 335 may have a single memory 310 attached thereto. By contrast, a processing unit such as processing unit 305 may be coupled with an interposer such as interposer 325 that has two memories 310 attached thereto.

Package 300 may enable a direct bus to the memories 310 from the processing units 305/315, and may be configurable to accommodate various memory heights that range from a single piece of memory to a memory stack. In this way when there is non-uniform memory access a hub of data may be stored between the two processing units 305 and 315.

It will be understood that the example package 300 is intended as an example of configuration options, and other embodiments may be arranged differently. For example, in some embodiments a package may include more or fewer processing units. In some embodiments one or more of the processing units may have additional or fewer interposers coupled thereto. The various interposers may have more or fewer memories coupled thereto. Although elements such as additional elements 110/210 are not depicted in FIG. 3, in some embodiments the packages may still include those additional elements.

Figure 4:
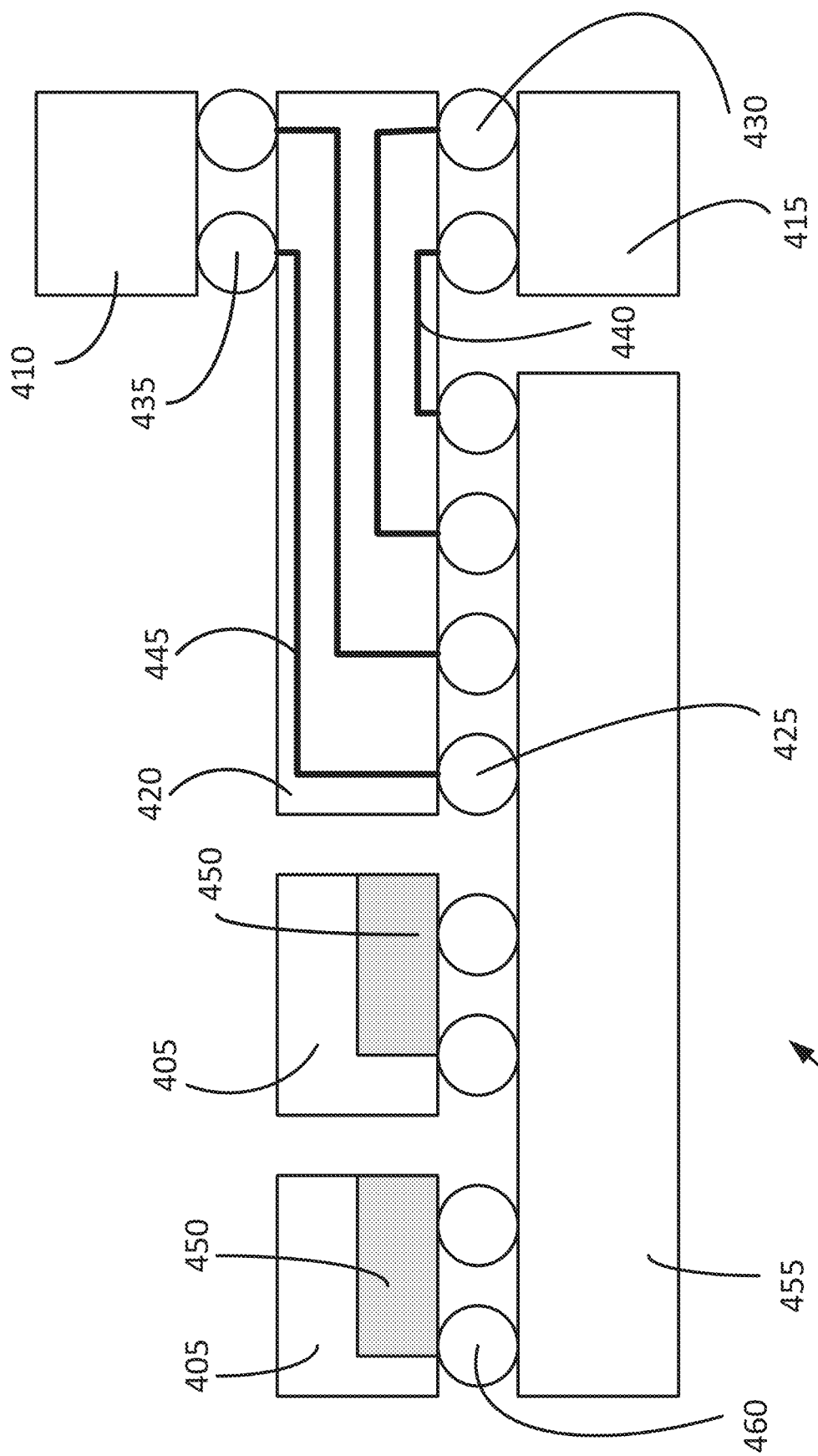
FIG. 4 depicts an alternative example semiconductor package structure, in accordance with various embodiments.

In some embodiments, the processing units may be disaggregated from monolithic form and instead contain a base die with both top and bottom-side electrical interconnects. These embodiments may include many top die, and may be used in these packages as a replacement for the monolithic integrated circuits 305/315. More specifically, a package may include a disaggregated processing unit such that the base die may include a plurality of core units, GPU units, FPGA units or some other type of element(s). In this embodiment, memory and additional elements may be coupled with the base die of this disaggregated processing unit. FIG. 4 depicts an example semiconductor package structure 400 which may include a plurality of processing units 405 coupled with a base die 455. The plurality of processing units 405 may, in combination, be similar in function to processing unit 105. The processing units 405 may include memory control logic 450, which may be similar to memory control logic 150. The semiconductor package structure 400 may further include an interposer 420, an additional element 410, and a memory 415, which may be respectively similar to interposer 120, additional element 110, and memory 115. The interposer 420 may include conductive pathways 440/445, which may be similar to conductive pathways 140/145. The additional element 410 may be coupled with the interposer 420 by solder bumps 435, which may be similar to solder bumps 135. Similarly, the memory 415 may be coupled with the interposer 420 by solder bumps 430, which may be similar to solder bumps 130.

In embodiments, the semiconductor package structure 400 includes a base die 455. The base die 455 may be, for example, an active or a passive interposer that may be coupled with a plurality of processing units 405. In some embodiments, the base die 455 may be assembled on or embedded within redistribution layers and then attached to, for example, a printed circuit board (PCB) or some other type of substrate. In these embodiments, the interconnects from the base of base die 455 and memory 415 to the PCB or substrate are not shown in FIG. 4 for the sake of lack of clutter of the Figures. The base die 455 may be coupled with the interposer 420 by solder bumps 425, which may be similar to solder bumps 125. There too could be redistribution layers across this surface. The base die 455 may further be coupled with the processing units 405 by solder bumps 460, which may likewise be similar to solder bumps 125.

Figure 5:
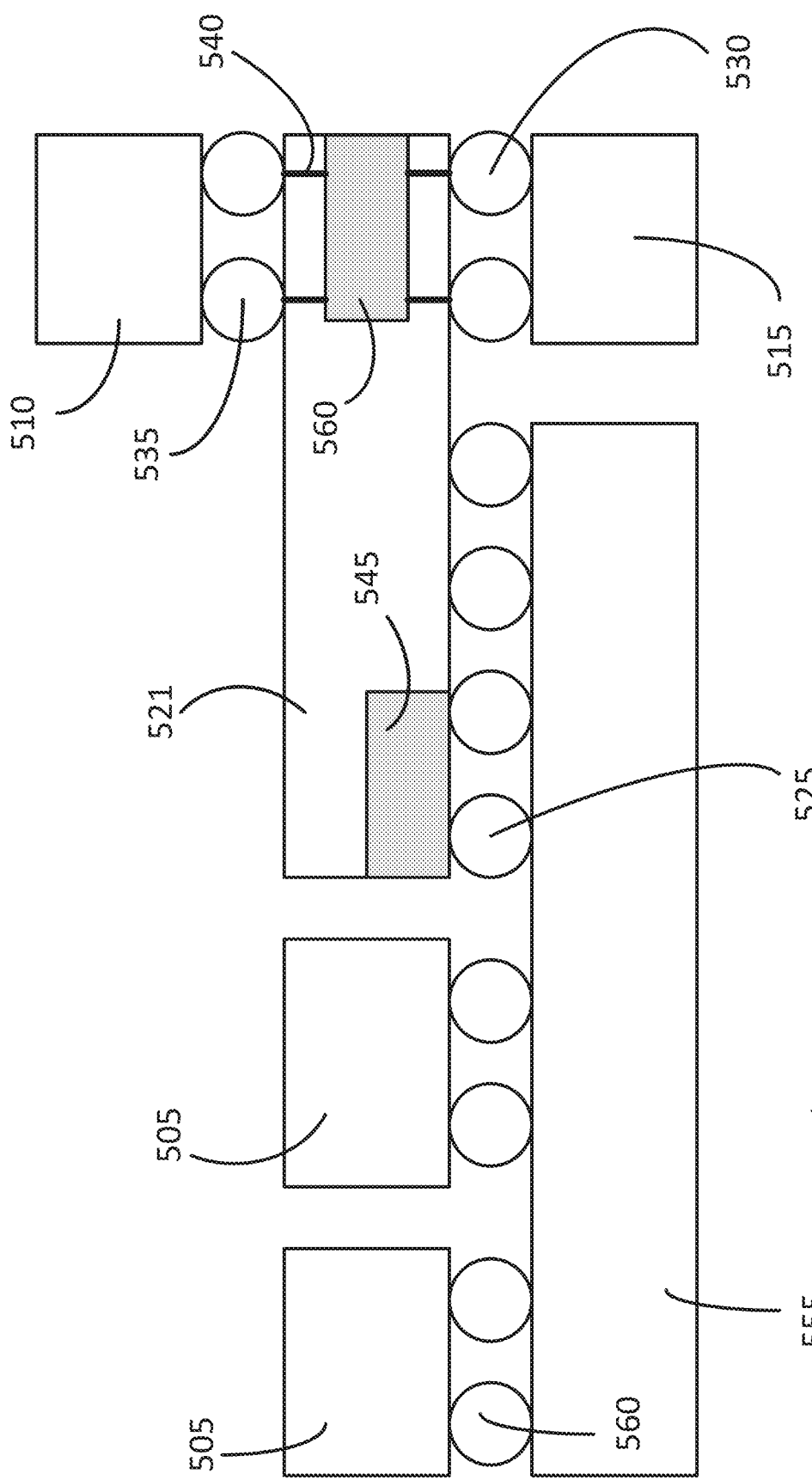
FIG. 5 depicts an alternative example semiconductor package structure, in accordance with various embodiments.

FIG. 5 depicts an alternative example of a semiconductor package structure 500 that includes a disaggregated die and a base die 555. Specifically, the semiconductor package structure 500 may include a plurality of processing units 505, which when in combination, may be similar to monolithic processing unit 205. The processing units 505 may be coupled with a base die 555 by solder bumps 560, which may be respectively similar to base die 455 and solder bumps 460.

The base die 555 may be coupled with an interposer 521 by solder bumps 525, which may be respectively similar to interposer 220 and solder bumps 425. The interposer 521 may include memory control logic 545 and 560, which may be respectively similar to memory control logic 245 and 260. The interposer 521 may additionally include conductive pathways 540, which may be similar to conductive pathways 240. Similarly to interposer 220, interposer 521 may include one or more conductive elements or pathways such as traces or vias that communicatively coupled memory control logics 545 and 560. However, those pathways are not depicted in FIG. 5 for the sake of avoidance of clutter.

The interposer 521 may be coupled with additional element 510 and memory 515, which may be respectively similar to additional element 210 and memory 215. The additional element 510 may be coupled with the interposer 521 by solder bumps 535, which may be similar to solder bumps 235. Similarly, the memory 515 may be coupled with the interposer 521 by solder bumps 530, which may be similar to solder bumps 230. Similar to that described for FIG. 2 the memory control logic may additionally or alternatively be found in element 510 or 515 or 505 or in some combination.

It will again be understood that the above descriptions of semiconductor package structures 400 and 500 are intended as examples of said semiconductor package structures. As in 455 and 415, 555 and 515 may either be embedded or assembled to a larger substrate, e.g., an organic coreless package, and then assembled as a composite to a PCB. In some embodiments more or fewer elements than are depicted in FIGS. 4 and 5 may be present in an arrangement such as that shown in FIG. 3. Likewise, in some embodiments certain of the elements may be larger or smaller in one or more dimensions than depicted in FIGS. 4 and 5.

In some legacy packages, if an HBM stack is used, it may include memory control logic. In this embodiment, the memory control logic may be positioned near the middle or the bottom of the stack. However, the memory control logic may be performance limited at high temperatures. In other words, the performance of the memory control logic may diminish if the temperature of the memory control logic exceeds approximately 95° Celsius (C). Therefore, in embodiments where tall or thick stacks of memory may not be needed, to meet capacity requirements, it may be advantageous to embed the memory in the substrate of the package, and move the memory control logic to the top of the package. Moving the memory control logic to the top of the package may provide the advantage of positioning the memory control logic closer to that heatsink of the package, and therefore helping to keep the memory control logic operating at a temperature that is more preferable.

Figure 6:
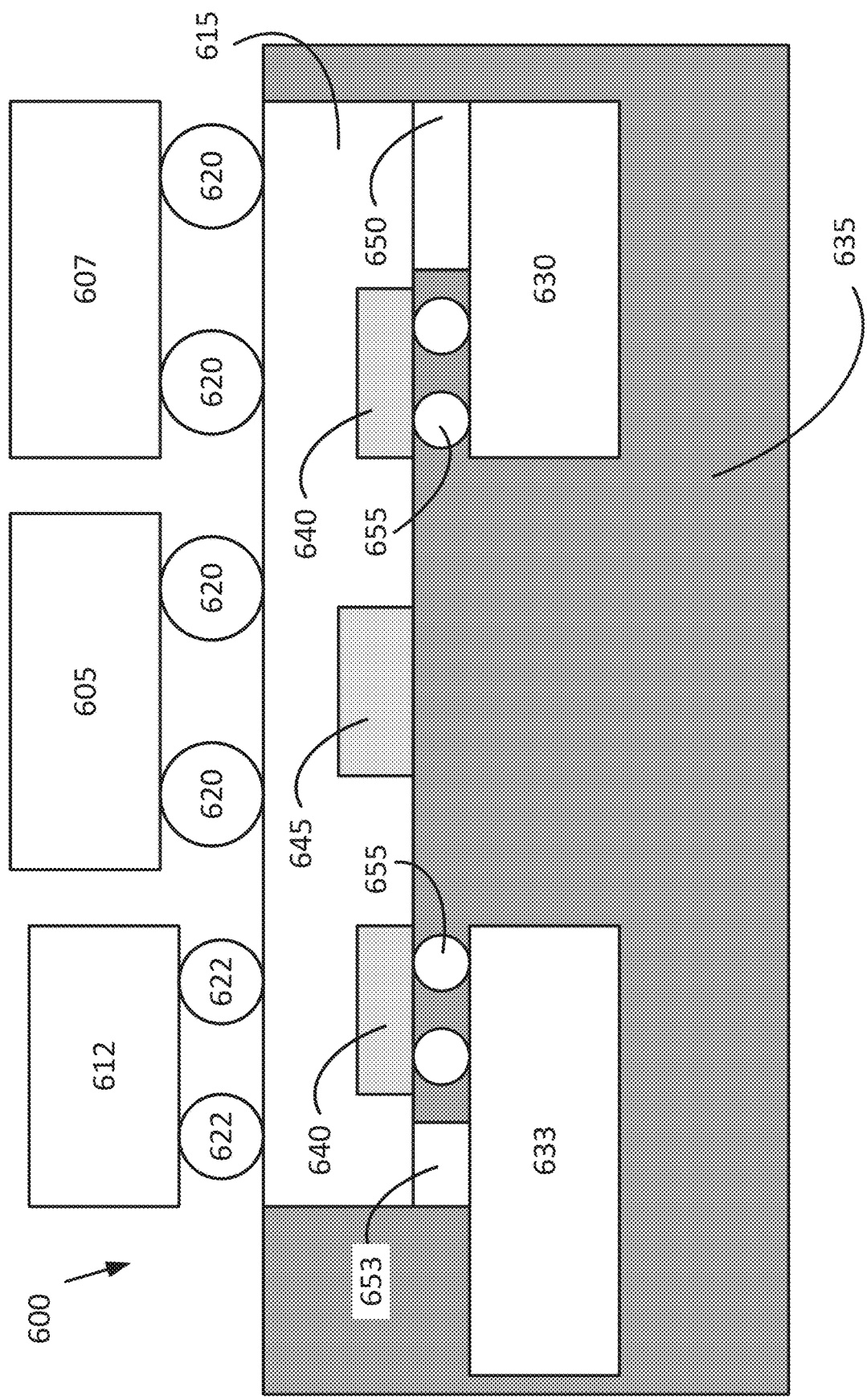
FIG. 6 depicts an alternative example semiconductor package, in accordance with various embodiments.

FIG. 6 depicts an example package 600 wherein the memory control logic may be positioned closer to a heatsink solution or some other element of the package, as described above. Specifically, FIG. 6 depicts an example package 600 where memory may be embedded in the package 600. Specifically, power may be routed in the package layers across the top of the memory.

Specifically, FIG. 6 depicts a package 600 that may include a substrate 635. The substrate 635 may be an organic cored or coreless substrate as described above. Memory such as memory 633 and 630, which may be similar to memory 115, may be embedded within the substrate 635 with dielectric layers such as organic build-up film. The package 600 may further include interposer 615 that may be assembled above or embedded below the substrate 635 in the package with the memory 633/630, and processing unit 605, which may be respectively similar to interposer 120, and processing unit 105. Specifically, as shown in FIG. 6, the interposer 615 may be embedded within substrate 635, however in other embodiments the interposer 615 may at least partially protrude from the substrate 635 in one or more directions. The package 600 may further include additional elements 607 and 612, which may be similar to additional element 110. More specifically, additional elements 607 and 612 may be, for example, a heatsink, a thermal management device, a memory, a processing unit, or some other type of element. In some embodiments, additional element 607 may be the same type of element as additional elements 612 or 605. For example, the may both be memories, they may both be heatsinks, etc. In other embodiments, additional element 607 may be a different type of element than additional element 612. The additional elements 607 and 612, and processing unit 605, may be coupled with the interposer 615 by electrical interconnects such as solder bumps 622 and 620, which may be similar to solder bumps 125 or 135. Likewise, memory 630 and 633 may be coupled with the interposer 615 by electrical interconnects e.g. solder bumps 655, which may be similar to solder bumps 130, when the interposer 615 is assembled on top of the package or alternatively by copper pads and traces if the interposer 615 were embedded in substrate 635. The interposer 615 may include memory control logic 645, which may be similar to memory control logic 150, 250, 245, or 260, or some combination thereof.

The interposer 615 may further include a memory bus such as memory buses 640. Specifically, the memory buses 640 may be coupled with the memory 630 and 633, and be configured to facilitate the transmission or reception of data or commands to or from the memory 630 and 633. In some embodiments, the memory buses 640 may include solder bumps 655, as in other embodiments the memory buses 640 may be elements of the interposer 615 coupled with the solder bumps 655. In some embodiments, the memory bus 640 may at least partially extend from the side of the interposer 615 that is facing the memory 630 and 633. In other embodiments, the memory bus 640 may be separate from, but communicatively coupled with the interposer 615 and the memory 630 and 633. In some embodiments, the memory bus 640 may be an element of the memory 630 or 633.

The package 600 may further include power routing 650 and 653 across the "top" of the memory 630 and 633 coming from the lower layers in the package via traces and via through the surrounding dielectric or from other devices on the interposer 615 or the substrate 635. As used herein, the "top" of the memory 630 and 633 may refer to the side of the memory that is closest to the interposer 615. More specifically, the power routing 653 and 650 may be coupled with the interposer 615, and configured to provide power from the interposer 615 to the memory 630 and 633. It will be understood that although the power routing 650 and 653 is shown as separate from, and coupled with, the interposer 615 and the memories 630 and 633, in some embodiments, the power routing 650 or 653 may be at least partially element of one or both of the interposer, the package, or the memory. For example, the power routing 650 or 653, may be positioned in a top layer of the memories 630 or 633 during the embedding process, and communicatively coupled with the interposer by solder bumps such as solder bumps 655 or further die embedding processes. In other embodiments, the power routing 650 or 653 may be positioned within or atop the interposer 615 and communicatively coupled with memories 630 or 633 by solder bumps such as solder bumps 655, or by one or more conductive elements such as vias, traces, or pads through copper plating. In some embodiments, power routing 650 or 653 may not be present, and rather the memory stack 633 or 630 may terminate with TSVs that can access power from the base of the substrate 635 and draw the power directly into the memory 633 and 630.

As shown in FIG. 6, in some embodiments the interposer 615 for the additional element 607 may cover the entirety of the width of a memory such as memory 630. By contrast, in some embodiments one or both of the interposer 615, and the additional element 612, may not cover the entirety of the width of a memory such as memory 633.

Additionally, as shown in FIG. 6, the pitch of the solder bumps such as solder bumps 655 may be different than the pitch of solder bumps such as solder bumps 622 or 620. Specifically, as used herein, the term "pitch" may refer to a distance from the center of one solder bump to another solder bump. As can be seen, solder bumps 655 may have a relatively narrow pitch, while solder bumps 622 and 620 may have a wider pitch than that of solder bumps 655. In some embodiments, solder bumps at the same level, for example solder bumps 622 and 620, may have a different pitch than one another. However, in other embodiments the pitches may be different. For example, in some embodiments the pitch of solder bumps 655 may be larger than that of solder bumps 622 or 620.

Figure 7:
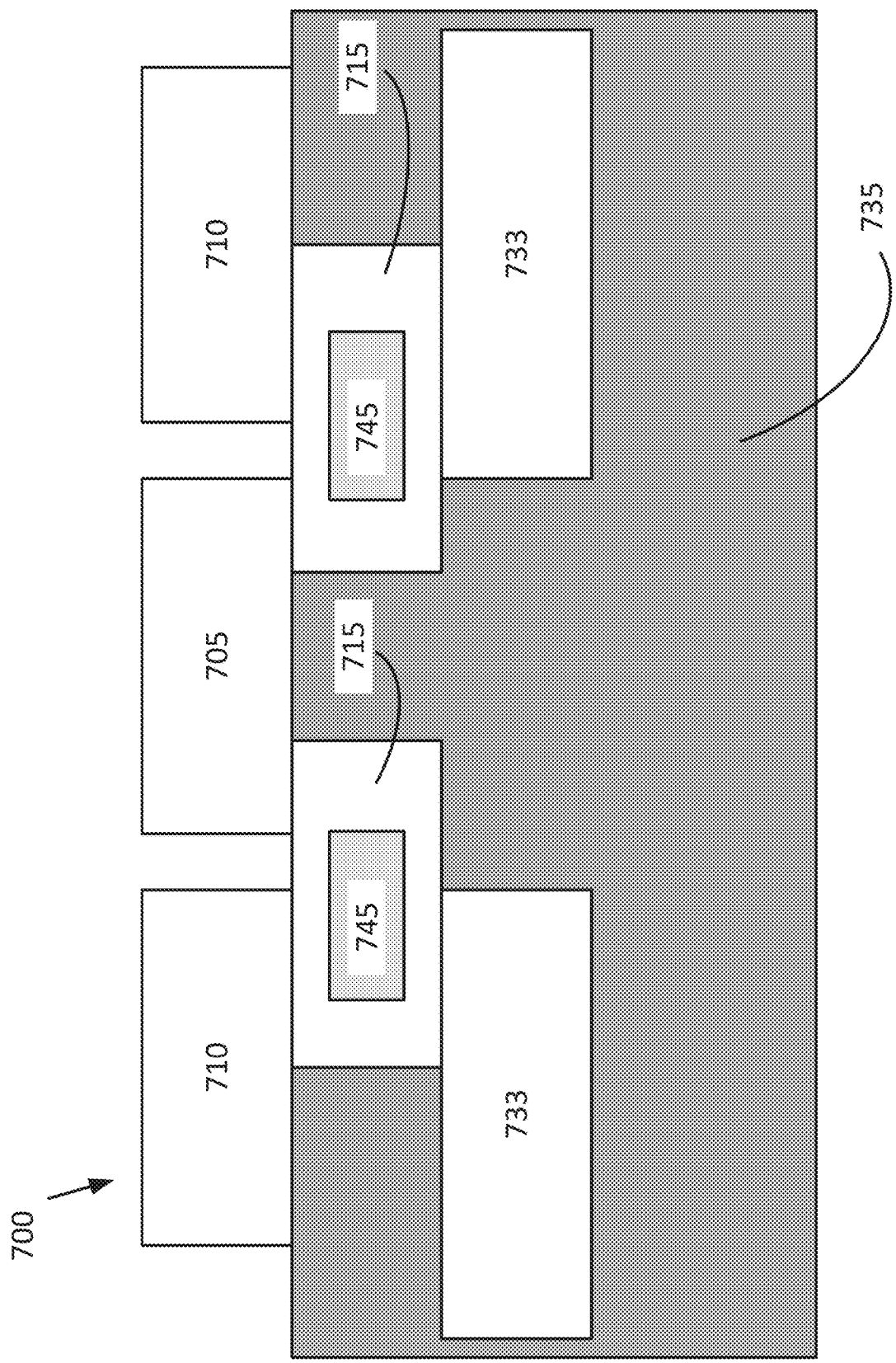
FIG. 7 depicts an alternative example semiconductor package, in accordance with various embodiments.

FIG. 7 depicts an alternative embodiment of a package 700. Specifically, package 700 may include a plurality of interposers 715, rather than one single interposer. The plurality of interposers may be advantageous, because then memory logic may be on the interposers, and power may be directly delivered to the processing unit on the top of the package and not through the interposer 715. Alternatively, numerous small interposers may be more affordable than one large interposer as shown in 615 The dual-sided interposer may provide a relatively short, direct path to the memory, and a thermal escape pathway to the heatsink. Alternatively, a hierarchical memory arrangement may be leveraged with memory disposed on both the top and bottom of the interposer, thereby increasing the available capacity.

Specifically, FIG. 7 depicts the package 700 may include a substrate 735, which may be similar to substrate 635. The package 700 may include additional elements 710, processing unit 705, and memory 733, which may be respectively similar to additional element 607, processing unit 605, and memories 630/633. In contrast to package 600, package 700 may include a plurality of interposers 715, which may be similar to interposer 615. In embodiments, the plurality of interposers 715 may be embedded into the substrate 735 as shown in FIG. 7, or into a separate substrate through fan-out encompassing the interposers and extending in dimension to, at a minimum, allow direct interconnection of additional elements 710 to the lower substrate 735. However, it will be understood that in other embodiments one or more of the interposers 715 may at least partially protrude from substrate 735. Respective ones of the interposers 715 may include a memory control logic 745, which may be similar to memory control logic 645. It will be understood the package 700 may include additional elements, for example a memory bus, electrical interconnects, or power routing as depicted in FIG. 6. However, those elements are not depicted in FIG. 7 for the sake of ease of illustration and lack of redundancy.

Generally, it will be understood that various elements and configurations of FIGS. 6 and 7 are intended as examples. Other embodiments may have other configurations, or a combination of elements in FIGS. 6 and 7. For example, in some embodiments the interposer 715 may cover the entirety of the width of memory 733 in a manner similar to that of interposer 615 and memory 630. In some embodiments, an interposer such as interposer 615 may or may not cover the entirety of the width of both memories such as memory 633 and memory 630.

In some embodiments, a monolithic processing unit such as 705 may be disaggregated to a composite assembly such as processing units 805 and base die 855 (described in greater detail below), where the function is approximately similar to that of monolithic processing unit 705. In this case the base die 855 (which may include a double sided interconnect) may be embedded in the package and a memory 815 may be embedded at the same layer in the stack as a base die. In this embodiment, an active or a passive die 820 may be used to connect memory to the base die. Again, if the die is active, then the memory control logic may be embedded in the die and allow for a more direct thermal escape route from the memory control logic. Furthermore, by removing this logic from the memory 815 or the base die 855 and moving it into a small top side die 820, the yield resiliency of the memory 815 and base die 855 may increase.

Figure 8:
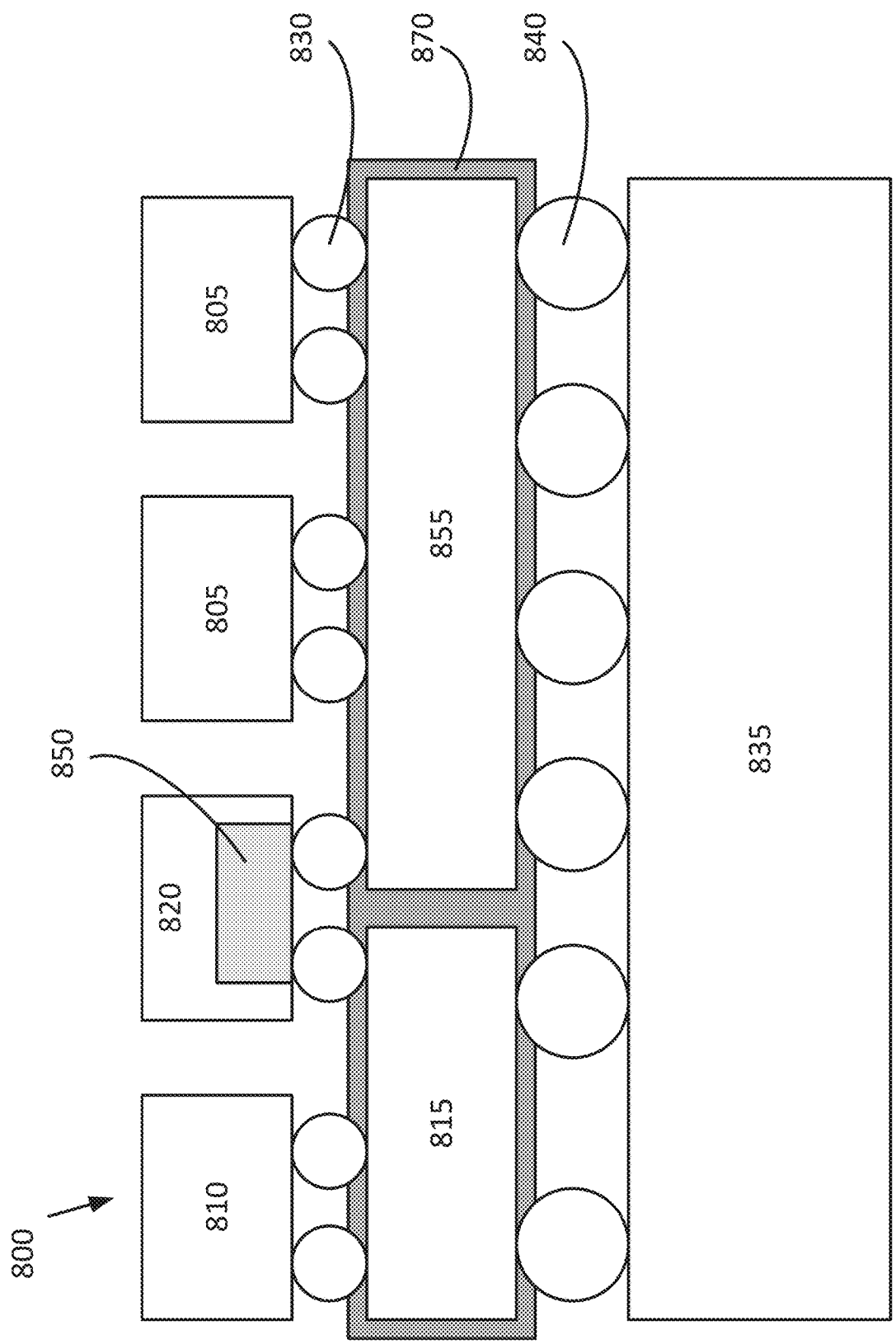
FIG. 8 depicts an alternative example semiconductor package, in accordance with various embodiments.

Specifically, FIG. 8 depicts a package 800 that may include one or more processing units 805, which may be similar to processing units 105. Generally, the package 800 may be coupled with a substrate 835 by solder bumps 840, which may be similar to one or more of solder bumps 125/130/135 or some other solder bumps described herein. The substrate may be similar to, for example, substrate 735.

The package 800 may further include a memory 815 and an additional element 810, which may be similar to memory 115 and additional element 110, respectively. The package 800 may further include a die 820 and a base die 855, which may be respectively similar to interposer 120 and base die 455. In embodiments, the die 820 may be an active die that includes memory control logic 850 which may be configured to perform one or more active operations with respect to memory 815 or additional element 810. Specifically, the operations may include a read command, a write command, etc. as described above.

In embodiments, the additional element 810, the die 820, and the processing units 805 may be coupled with the memory 815 or the base die 855 by solder bumps 830 as shown in FIG. 8. The solder bumps 830 may be similar to, for example, solder bumps 125/130/135 etc. or some other solder bump described herein. In other embodiments, one or both of solder bumps 830 or 840 may be copper plated interconnects or some other type of electrical interconnect. However, as noted above, the term "solder bump" may be used herein for the sake of consistency of description. In embodiments, although the solder bumps 830 are depicted in FIG. 8 as having generally the same size as one another, in other embodiments one or more of the solder bumps 830 may be a different size than another of the solder bumps 830. Similarly, although solder bumps 830 are all depicted as having generally the same pitch, in other embodiments two or more of solder bumps 830 may have a different pitch than other ones of solder bumps 830. As can be seen, in embodiments solder bumps 840 may have a different pitch than solder bumps 830. In other embodiments, one or more of solder bumps 840 may be smaller than depicted, for example being smaller than another of solder bumps 840 or smaller than solder bump 830, especially if the memory 815 and the base die 855 are embedded in substrate 835, e.g., through a fan-out technique, and is then coupled to 835 through solder balls. Similarly, in other embodiments, two or more of solder bumps 840 may have a pitch that is different than depicted, for example having a pitch that is smaller than the pitch of solder bumps 830.

In some embodiments, the memory 815 and the base die 855 may be embedded within an additional substrate such as substrate 870. The substrate 870 may include one or more traces, or some other conductive element, which may serve as redistribution layer(s) on one or both sides of the substrate 870. More specifically, the substrate 870 may allow signals to propagate through the substrate 870 to or from the memory 815 or the base die 855. In other embodiments, one or both of the memory 815 and the base die 855 may at least partially protrude from the substrate 870, or the substrate 870 may not be present.

As can be seen, the die 820 may connect memory 815 and base die 855. As a result, a processing unit such as processing unit 805 may be communicatively coupled with the die 820 through base die 855. The die 820 may in turn be communicatively coupled with memory 815 and, through memory 815, additional element 810. In operation, the processing unit 805 may transmit a memory access request through the base die 855 to die 820, and more specifically to memory control logic 850. The memory control logic 850 may then access memory 815 or the additional element 810 through memory 815 or along redistribution layers atop 815 if additional element 810 is a memory. If the memory access request was a read command, the memory controller 850 may read data from the memory 815 or the additional element 810 and return that data to the processing unit 805 through the base die 855 or across redistribution layers atop 855 such as those within substrate 870.

It will be understood that embodiments herein are intended as examples, and other embodiments may have different arrangements. For example, with respect to FIG. 8 or some other Figure herein, one or more elements such as additional element 110/810/etc. may be missing. In Figures where multiple processing units such as processing units 805 are shown, more or fewer processing units may be present in other embodiments. Other embodiments may likewise include different arrangements of elements.

Figure 9:
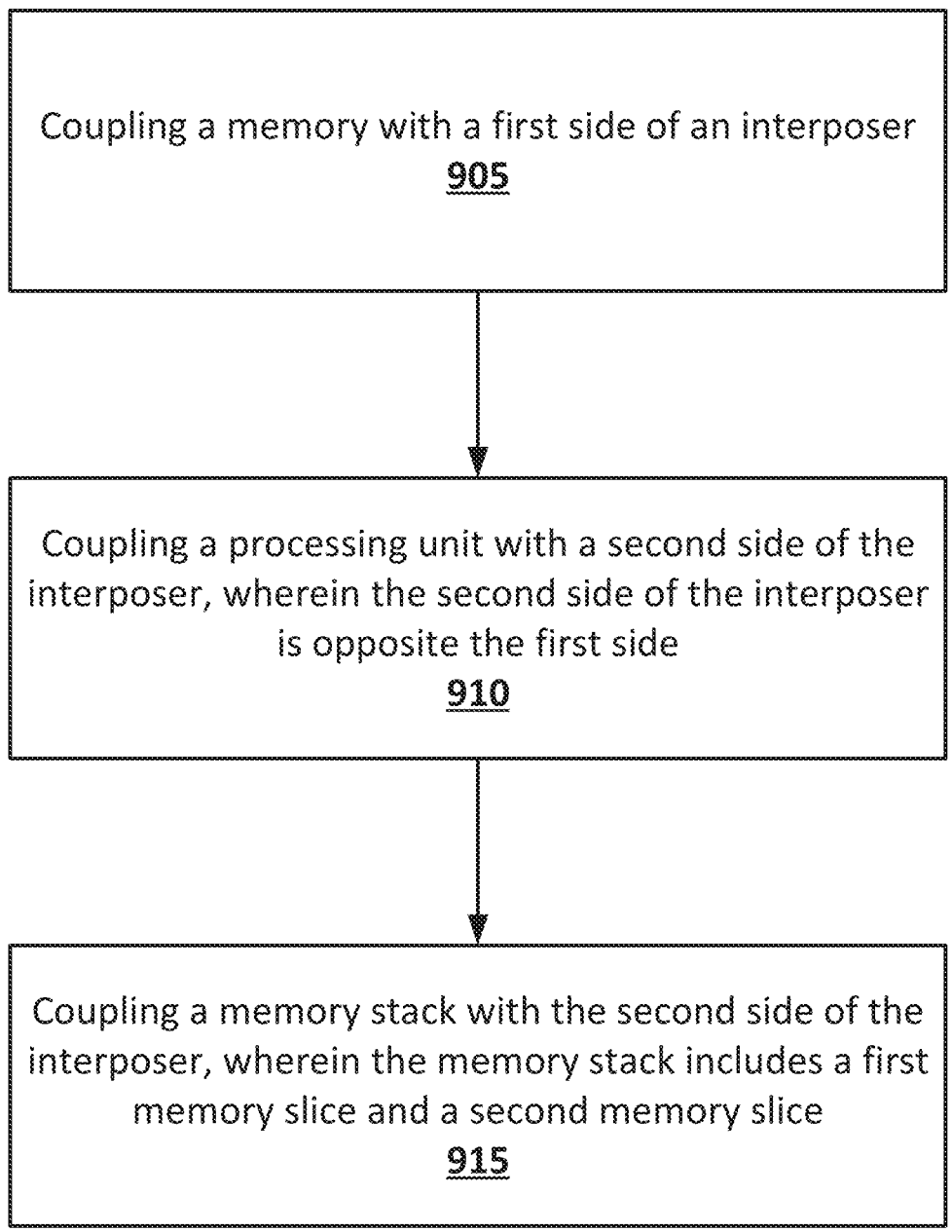
FIG. 9 depicts an example technique that may be used to manufacture one or more of the semiconductor packages herein, in accordance with various embodiments.

FIG. 9 depicts a simplified example technique by which various package herein may be constructed. FIG. 9 may be described herein with respect to package 100, however it will be understood that the technique may be altered by one of skill in the art to apply to one or more of the other packages discussed herein.

The technique may include coupling, at 905, a memory with a first side of an interposer. The memory may be, for example, memory 115 and the interposer may be, for example, interposer 120. The technique may further include coupling, at 910, a processing unit with a second side of the interposer. The processing unit may be, for example, processing unit 105. As can be seen in FIG. 1, the first side of the interposer (e.g., the side to which the memory is coupled) may be opposite the second side of the interposer. The technique may further include coupling, at 915, a memory stack with the second side of the interposer. The memory stack may be, for example, similar to additional element 110. Specifically, in this example, the memory stack may include at least a first memory slice and a second memory slice.

It will be understood that the above example technique is intended as an example. In some embodiments, one or more of the elements may be performed in a different order than described herein. For example, in embodiments element 905 may be performed concurrently with, or subsequent to, element 910 or 915. Similarly, element 910 may be performed concurrently with, or subsequent to, element 915. In some embodiments, the technique may include additional elements such as coupling one or more of the elements to a disaggregated die through the base die or a substrate, or some other element discussed herein.

Figure 10:
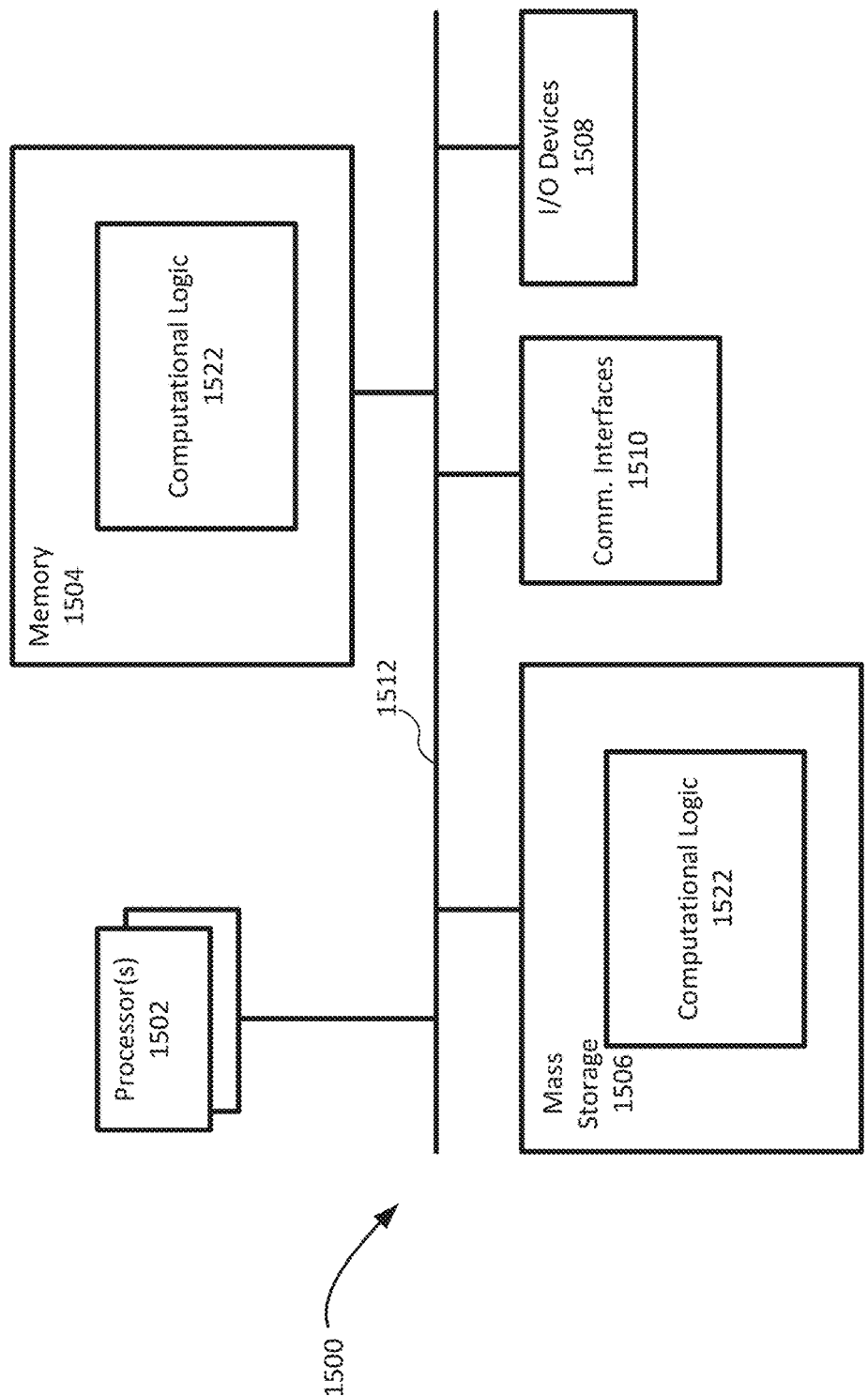
FIG. 10 illustrates an example device, in accordance with various embodiments.

FIG. 10 illustrates an example computing device 1500 suitable for use with various semiconductor packages or semiconductor package structures described herein. As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a central processing unit (CPU), a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., dynamic random-access memory (DRAM), compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth.

The computing device 1500 may further include input/output (I/O) devices 1508 (such as a display (e.g., a touch-screen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

For one embodiment, at least one of processors 1502 may be packaged together with computational logic 1522 configured to practice aspects of optical signal transmission and receipt described herein to form a System in Package (SiP) or a System on Chip (SoC).

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In various embodiments, one or more of semiconductor package structures 100, 200, 400, or 500, or semiconductor packages 300, 600, 700, 800, may include one or more of the elements of FIG. 10. For example, in embodiments and element such as processing unit 105, or some other processing unit in one of FIGS. 1-8, may be processor 1502. Similarly, memory 115 or additional element 110 may be a memory such as memory 1504 or mass storage 1506. Other embodiments of the various semiconductor package structures or semiconductor packages may incorporate other elements of FIG. 10 in ways that would be readily understood by one of skill in the art.

EXAMPLES OF VARIOUS EMBODIMENTS

Example 1 includes a semiconductor package structure comprising: an interposer with a first side and a second side opposite the first side; a memory communicatively and physically coupled with the first side of the interposer; a processing unit communicatively and physically coupled with the second side of the interposer, wherein the processing unit is communicatively coupled, by the interposer, with the memory; and a third chip coupled with the second side of the interposer.

Example 2 includes the semiconductor package structure of example 1, wherein the memory is a dynamic random-access memory (DRAM).

Example 3 includes the semiconductor package structure of example 1, wherein the memory is a non-volatile memory (NVM).

Example 4 includes the semiconductor package structure of example 1, wherein the memory is an embedded dynamic random-access memory (eDRAM).

Example 5 includes the semiconductor package structure of example 1, wherein the memory is a static random-access memory (SRAM).

Example 6 includes the semiconductor package structure of any of examples 1-5, wherein the memory is a memory stack that includes a first memory slice and a second memory slice.

Example 7 includes the semiconductor package structure of any of examples 1-5, wherein the memory is a high bandwidth memory (HBM) that is to use a bus with a minimum bandwidth of 256 bits per second.

Example 8 includes the semiconductor package structure of any of examples 1-5, wherein the processing unit is a central processing unit (CPU), a general processing unit (GPU), or a field programmable gate array (FPGA).

Example 9 includes the semiconductor package structure of any of examples 1-5, wherein the interposer is an active interposer that includes processing logic that is to process signals received from the memory or the processing unit.

Example 10 includes the semiconductor package structure of any of examples 1-5, wherein the interposer further includes memory control logic to control the memory.

Example 11 includes the semiconductor package structure of any of examples 1-5, wherein the third chip is a thermal management device.

Example 12 includes the semiconductor package structure of any of examples 1-5, wherein the third chip is a memory.

Example 13 includes a semiconductor package structure comprising: a first interposer with a first side and a second side opposite the first side; a processing unit physically and communicatively coupled with the second side of the first interposer; a second interposer with a first side and a second side opposite the first side, wherein the first side of the second interposer is physically and communicatively coupled with the second side of the first interposer; a memory physically and communicatively coupled with one of the first side and the second side of the second interposer; and a third chip coupled with one of the first side and the second side of the second interposer that is different than the side to which the memory is coupled.

Example 14 includes the semiconductor package structure of example 13, wherein the first side of the first interposer is to couple with a substrate.

Example 15 includes the semiconductor package structure of example 13, wherein the memory is a dynamic random-access memory (DRAM), a non-volatile memory (NVM), an embedded DRAM (eDRAM), or a static random-access memory (SRAM).

Example 16 includes the semiconductor package structure of example 13, wherein the memory is a memory stack that includes a first memory slice and a second memory slice.

Example 17 includes the semiconductor package structure of example 13, wherein the memory is a high bandwidth memory (HBM) that is to use a bus with a minimum bandwidth of 256 bits per second.

Example 18 includes the semiconductor package structure of any of examples 13-17, where the third chip is a memory.

Example 19 includes the semiconductor package structure of any of examples 13-17, wherein the third chip is a heat sink.

Example 20 includes the semiconductor package structure of any of examples 13-17, wherein the processing unit is a central processing unit (CPU), a general processing unit (GPU), a core of a multi-core processor, or a field programmable gate array (FPGA).

Example 21 includes the semiconductor package structure of any of examples 13-17, wherein the second interposer is an active interposer that includes processing logic that is to process signals received from the memory, the processing unit, or the third chip.

Example 22 includes the semiconductor package structure of any of examples 13-17, wherein the processing unit is a first processing unit, and further comprising a second processing unit physically and communicatively coupled with the first interposer.

Example 23 includes the semiconductor package structure of example 22, wherein the first interposer includes a first interposer sub-die and a second interposer sub-die that is adjacent to the first interposer sub-die, wherein the first interposer sub-die and the second interposer sub-die are communicatively coupled with one another by an active or passive die.

Example 24 includes a semiconductor package comprising: a substrate; an interposer with a first side and a second side opposite the first side, wherein the first side of the interposer is coupled with the substrate; a processing unit physically and communicatively coupled with the second side of the interposer; a memory controller with a first side that is physically and communicatively coupled with the second side of the interposer; and a memory that has a first side and a second side opposite the first side, wherein the first side of the memory is physically and communicatively coupled with the first side of the memory controller and the second side of the memory is coupled with the substrate.

Example 25 includes the semiconductor package of example 24, wherein the memory is a memory stack that includes a first memory slice and a second memory slice.

Example 26 includes the semiconductor package of example 24, wherein the memory is a high bandwidth memory (HBM) that is to use a bus with a minimum bandwidth of 256 bits per second.

Example 27 includes the semiconductor package of example 24, wherein the memory is a dynamic random-access memory (DRAM), a non-volatile memory (NVM), an embedded DRAM (eDRAM), or a static random-access memory (SRAM).

Example 28 includes the semiconductor package of example 24, further comprising a memory stack physically and communicatively coupled with the first side of the memory.

Example 29 includes the semiconductor package of example 24, wherein the processing unit is a central processing unit (CPU), a general processing unit (GPU), a core of a multi-core processor, or a field programmable gate array (FPGA).

Example 30 includes the semiconductor package of any of examples 24-29, wherein the interposer is an active interposer that includes processing logic that is to process signals received from the memory or the processing unit.

Example 31 includes the semiconductor package of any of examples 24-29, wherein the processing unit is a first processing unit, and further comprising a second processing unit physically and communicatively coupled with a first side coupled with the interposer.

Example 32 includes the semiconductor package of example 31, wherein the interposer is a first interposer, and further comprising a second interposer communicatively and physically coupled with the second processing unit.

Example 33 includes a semiconductor package comprising: a substrate; an interposer with a first side and a second side opposite the first side, wherein the first side of the interposer is coupled with the substrate; a processing unit physically and communicatively coupled with the second side of the interposer; a second interposer with a first side that is physically and communicatively coupled with the substrate and adjacent to the first interposer; and a memory that is physically and communicatively coupled on the second side of the second interposer; a third chip that is coupled with the second side of the second interposer and the first interposer.

Example 34 includes the semiconductor package of example 33, wherein the memory is a dynamic random-access memory (DRAM), a non-volatile memory (NVM), an embedded DRAM (eDRAM), or a static random-access memory (SRAM).

Example 35 includes the semiconductor package of example 33, wherein the memory is a memory stack that includes a first memory slice and a second memory slice.

Example 36 includes the semiconductor package of example 33, wherein the memory is a high bandwidth memory (HBM) that is to use a bus with a minimum bandwidth of 256 bits per second.

Example 37 includes the semiconductor package of example 33, wherein the processing unit is a central processing unit (CPU), a general processing unit (GPU), a core of a multi-core processor, or a field programmable gate array (FPGA).

Example 38 includes the semiconductor package of any of examples 33-37, wherein the third chip is a logic for a memory controller communicatively coupled, from the second side of the second interposer to the second side of the first interposer, with the processing unit.

Example 39 includes the semiconductor package of any of examples 33-37, wherein the second interposer is a DRAM stack.

Example 40 includes the semiconductor package of any of examples 33-37, wherein the logic for the memory controller and excess SRAM spans the first and second interposer.

Example 41 includes the semiconductor package of any of examples 33-37, wherein the first and second interposer is embedded within dielectric material of the semiconductor package.

Example 42 includes a method of forming a semiconductor package, wherein the method comprises: coupling a memory with a first side of an interposer; coupling a processing unit with a second side of the interposer, wherein the second side of the interposer is opposite the first side; and coupling a memory stack with the second side of the interposer, wherein the memory stack includes a first memory slice and a second memory slice.

Example 43 includes the method of example 42, further comprising: embedding the memory in a substrate; and coupling the first side of the interposer with the substrate.

Example 44 includes the method of example 42, wherein the memory is a dynamic random-access memory (DRAM), a non-volatile memory (NVM), an embedded DRAM (eDRAM), or a static random-access memory (SRAM).

Example 45 includes the method of example 42, wherein the memory is a high bandwidth memory (HBM) that is to use a bus with a minimum bandwidth of 256 bits per second.

Example 46 includes the method of any of examples 42-45, wherein the interposer is an active interposer that includes processing logic that is to process signals received from the memory or the processing unit.

Example 47 includes one or more non-transitory computer-readable media comprising instructions that, upon execution of the instructions by a memory controller of a semiconductor package, are to cause the memory controller to: identify a memory request from a processing unit coupled with a first side of an interposer, wherein the interposer has a first side and a second side opposite the first side, and wherein the memory request includes a memory address; identify, based on the memory address, a memory location of a first high bandwidth memory (HBM) dynamic random-access memory (DRAM) coupled with the first side of the interposer or a second HBM DRAM coupled with the second side of the interposer; and access data of the memory location.

Example 48 includes the one or more non-transitory computer-readable media of example 47, wherein the first HBM DRAM has a first memory address space and the second HBM DRAM has a second memory address space that is different from the first memory address space.

Example 49 includes the one or more non-transitory computer-readable media of example 48, wherein the instructions are to access data of the memory location using a 1024-bit memory bus.

Example 50 includes the one or more non-transitory computer-readable media of example 47, wherein the first HBM DRAM shares a memory address space with the second HBM DRAM.

Example 51 includes the one or more non-transitory computer-readable media of example 50, wherein the instructions are to access data of the memory location using a 2048-bit memory bus.

Example 52 includes the one or more non-transitory computer-readable media of any of examples 47-51, wherein the instructions are to identify a size of a memory bus which is to be used to access the data of the memory location based on a workload of the semiconductor package.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the various embodiments, including what is described in the Abstract, is not intended to be exhaustive or to limit the description to the precise forms disclosed. While specific implementations of, and examples for, various embodiments are described herein for illustrative purposes, various equivalent modifications are possible, as those skilled in the relevant art will recognize. These modifications may be made in light of the above detailed description.

The invention claimed is:

1. A semiconductor package structure comprising:
  a substrate;
  an interposer with a first side and a second side opposite the first side;
  a memory, embedded in the substrate, communicatively and physically coupled with the first side of the interposer;
  a processing unit communicatively and physically coupled with the second side of the interposer, wherein the processing unit is communicatively coupled, by the interposer, with the memory; and
  a third chip coupled with the second side of the interposer.

2. The semiconductor package structure of claim 1, wherein the memory is a memory stack that includes a first memory slice and a second memory slice.

3. The semiconductor package structure of claim 1, wherein the memory is a high bandwidth memory (HBM) that is to use a bus with a minimum bandwidth of 256 bits per second.

4. The semiconductor package structure of claim 1, wherein the interposer is an active interposer that includes processing logic that is to process signals received from the memory or the processing unit.

5. The semiconductor package structure of claim 1, wherein the interposer further includes memory control logic to control the memory.

6. The semiconductor package structure of claim 1, wherein the third chip is a thermal management device or a memory.

7. The semiconductor package structure of claim 1, wherein the interposer is at least partially embedded in the substrate.

8. A semiconductor package structure comprising:
  a first interposer with a first side and a second side opposite the first side;
  a processing unit physically and communicatively coupled with the second side of the first interposer;
  a second interposer with a first side and a second side opposite the first side, wherein the first side of the second interposer is physically and communicatively coupled with the second side of the first interposer;
  a memory physically and communicatively coupled with one of the first side and the second side of the second interposer; and
  a third chip coupled with one of the first side and the second side of the second interposer that is different than the side to which the memory is coupled.

9. The semiconductor package structure of claim 8, wherein the first side of the first interposer is to couple with a substrate.

10. The semiconductor package structure of claim 8, wherein the memory is a memory stack that includes a first memory slice and a second memory slice.

11. The semiconductor package structure of claim 8, wherein the memory is a high bandwidth memory (HBM) that is to use a bus with a minimum bandwidth of 256 bits per second.

12. The semiconductor package structure of claim 8, where the third chip is a memory.

13. The semiconductor package structure of claim 8, wherein the third chip is a heat sink.

14. The semiconductor package structure of claim 8, wherein the second interposer is an active interposer that includes processing logic that is to process signals received from the memory, the processing unit, or the third chip.

15. The semiconductor package structure of claim 8, wherein the processing unit is a first processing unit, and further comprising a second processing unit physically and communicatively coupled with the first interposer.

16. A semiconductor package comprising:
a substrate;
a first interposer with a first side and a second side opposite the first side, wherein the first side of the first interposer is coupled with the substrate;
a processing unit physically and communicatively coupled with the second side of the first interposer;
a second interposer with a first side that is physically and communicatively coupled with the substrate and adjacent to the first interposer;
a memory that is physically and communicatively coupled on the second side of the second interposer; and
a third chip that is coupled with the second side of the second interposer and the second side of the first interposer.

17. The semiconductor package of claim 16, wherein the memory is a memory stack that includes a first memory slice and a second memory slice.

18. The semiconductor package of claim 16, wherein the memory is a high bandwidth memory (HBM) that is to use a bus with a minimum bandwidth of 256 bits per second.

19. The semiconductor package of claim 16, wherein the third chip is a logic for a memory controller communicatively coupled, from the second side of the second interposer to the second side of the first interposer, with the processing unit.

20. The semiconductor package of claim 16, wherein the first and second interposer is embedded within dielectric material of the semiconductor package.

21. A method of forming a semiconductor package, wherein the method comprises:
embedding a memory in a substrate;
coupling the memory with a first side of an interposer;
coupling the first side of the interposer with the substrate;
coupling a processing unit with a second side of the interposer, wherein the second side of the interposer is opposite the first side; and
coupling a memory stack with the second side of the interposer, wherein the memory stack includes a first memory slice and a second memory slice.

22. The method of claim 21, further comprising:
coupling a third chip with the second side of the interposer.

23. The method of claim 21, wherein the memory is a dynamic random-access memory (DRAM), a non-volatile memory (NVM), an embedded DRAM (eDRAM), or a static random-access memory (SRAM).

24. The method of claim 21, wherein the memory is a high bandwidth memory (HBM) that is to use a bus with a minimum bandwidth of 256 bits per second.

25. The method of claim 21, wherein the interposer is an active interposer that includes processing logic that is to process signals received from the memory or the processing unit.

* * * * *